United States Patent
Ku et al.

(10) Patent No.: US 9,093,180 B2
(45) Date of Patent: Jul. 28, 2015

(54) SEMICONDUCTOR MEMORY DEVICE

(71) Applicant: SK hynix Inc., Gyeonggi-do (KR)

(72) Inventors: Young-Jun Ku, Gyeonggi-do (KR); Ki-Ho Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/524,503

(22) Filed: Oct. 27, 2014

(65) Prior Publication Data

US 2015/0043289 A1 Feb. 12, 2015

Related U.S. Application Data

(62) Division of application No. 14/104,933, filed on Dec. 12, 2013, now Pat. No. 8,897,081, which is a division of application No. 13/100,906, filed on May 4, 2011, now Pat. No. 8,625,363.

(30) Foreign Application Priority Data

Feb. 28, 2011 (KR) ........................ 10-2011-0017804

(51) Int. Cl.
*G11C 7/00* (2006.01)
*G11C 8/00* (2006.01)
*G11C 29/26* (2006.01)
*G11C 7/10* (2006.01)
*G11C 29/40* (2006.01)
*G11C 29/08* (2006.01)

(52) U.S. Cl.
CPC .............. *G11C 29/26* (2013.01); *G11C 7/1006* (2013.01); *G11C 29/08* (2013.01); *G11C 29/40* (2013.01); *G11C 2029/2602* (2013.01)

(58) Field of Classification Search
USPC ............. 365/189.05, 189.15, 189.16, 189.17, 365/201, 230.03, 230.06
See application file for complete search history.

(56) References Cited

U.S. PATENT DOCUMENTS 7,706,199 B2 * 4/2010 Ku et al. ........................ 365/201
8,024,627 B2 * 9/2011 Song .............................. 365/201

* cited by examiner

*Primary Examiner* — Trong Phan
(74) *Attorney, Agent, or Firm* — IP & T Group LLP

(57) ABSTRACT

A semiconductor memory device includes a plurality of banks, a plurality of compression blocks configured to compress a plurality of first read data respectively provided by the banks and output a plurality of second read data, a plurality of pipe latches configured to latch the second read data and output third read data in series, an output controller configured to receive the third read data from the pipe latches and sequentially output fourth read data in response to a plurality of bank addresses and a read enable signal, and a pad configured to transfer the fourth read data sequentially outputted from the output controller to an outside of the semiconductor memory device.

20 Claims, 16 Drawing Sheets

SEMICONDUCTOR MEMORY DEVICE

CROSS-REFERENCE TO RELATED APPLICATIONS

This application is a division of U.S. patent application Ser. No. 14/104,933 filed on Dec. 12, 2013 and now issued as U.S. Pat. No. 8,897.081, which is a division of U.S. patent application Ser. No. 13/100,906 filed on May 4, 2011, now U.S. Pat. No. 8,625,363, which claims priority of Korean Patent Application No. 10-2011-0017804, filed on Feb. 28, 2011. The disclosure of each of the foregoing application is incorporated herein by reference in its entirety.

BACKGROUND

1. Field

Exemplary embodiments of the present invention relate to a semiconductor design technology, and more particularly, to a test item for a semiconductor memory device.

2. Description of the Related Art

In general, semiconductor memory devices, such as a Dynamic Random Access Memory (DRAM) device, support diverse test items. Diverse tests are performed to reduce the production costs of a semiconductor memory device and improve yield. Among such tests is a parallel test, which allows for a shorter test time.

Hereafter, the background of the parallel test is examined. It is important to test thousands of memory cells at a high speed as well as testing the semiconductor memory device with high reliability. Particularly, since the shortening of the test time until the shipment of products as well as shortening the time for developing a semiconductor memory device directly affect the production cost of the product, shortening the test time is a significant issue in terms of production efficiency and competition between manufacturers. The conventional semiconductor memory devices are tested for each memory cell to examine whether the memory cell has a failure or not. As a semiconductor memory device is highly integrated, the test time is increased in proportion to the integration degree. To reduce the time taken for the failure test, a parallel test is introduced. The process of the parallel test is performed as follows.

Briefly, in the parallel test, the same data are written in a plurality of cells. Then, when the same data are read from the cells using an exclusive OR gate, '1' is outputted and a pass decision is made for the cells. When a different data is read from any one of the cells, '0' is outputted and a failure decision is made. This parallel test is not performed for each memory cell, but performed by activating many banks at the same time and performing write and read operations. Therefore, the parallel test may shorten the test time.

Meanwhile, Double Data Rate 3 (DDR3) Dynamic Random Access Memory (DRAM) devices support a parallel test of an X4 mode and an X8 mode. The X4 mode performs a parallel test by using 4 pads, while the X8 mode performs a parallel test by using 8 pads.

Hereafter, a parallel test of the X4 mode is taken as an example and described.

First, a read path of a conventional semiconductor memory device is described with reference to FIG. 1.

FIG. 1 is a block diagram illustrating a read path of a conventional semiconductor memory device.

Referring to FIG. 1, the read path of the conventional semiconductor memory device includes first to eighth banks 111, 112, 113, 114, 115, 116, 117 and 118, each including a memory cell array of a plurality of memory cells; first to eighth compression blocks 121, 122, 123, 124, 125, 126, 127 and 128, which compress first to eighth bank data TGIO#<0:127> outputted from the first to eighth banks 111 to 118, respectively, and output first to eighth compressed data GIO_OT#<0:7> individually; and a read circuit 130 for outputting first to fourth read data DATA_DRV<0:3> to first to fourth pads DQ0, DQ1, DQ2 and DQ3, respectively, in response to the first to eighth compressed data GIO_OT#<0:7> and a read enable signal DRV_EN. Herein, the first to eighth bank data TGIO#<0:127> are transferred through a first global input/output line disposed in a core region, and the first to eighth compressed data GIO_OT#<0:7> outputted from each compression block are transferred through a second global input/output line disposed in a peripheral region.

Meanwhile, the read circuit 130 includes first to fourth pipe latches 131A, 133A, 135A and 137A and first to fourth output circuits 131B, 133B, 135B and 137B. The first pipe latch 131A serializes a plurality of first compressed data GIO_OT0<0:7> or a plurality of second compressed data GIO_OT1<0:7> outputted from any one between the first compression block 121 and the second compression block 122 to output a first serial data DOUT<0>. The second pipe latch 133A serializes a plurality of third compressed data GIO_OT2<0:7> or a plurality of fourth compressed data GIO_OT3<0:7> outputted from any one between the third compression block 123 and the fourth compression block 124 to output a second serial data DOUT<1>. The third pipe latch 135A serializes a plurality of fifth compressed data GIO_OT4<0:7> or a plurality of sixth compressed data GIO_OT5<0:7> outputted from any one between the fifth compression block 125 and the sixth compression block 126 to output a third serial data DOUT<2>. The fourth pipe latch 137A serializes a plurality of seventh compressed data GIO_OT6<0:7> or a plurality of eighth compressed data GIO_OT7<0:7> outputted from any one between the seventh compression block 127 and the eighth compression block 128 to output a fourth serial data DOUT<3>. The first to fourth output circuits 131B, 133B, 135B and 137B output the first to fourth serial data DOUT<0:3> as the first to fourth read data DATA_DRV<0:3> to the first to fourth pads DQ0 to DQ3 in response to the read enable signal DRV_EN.

Subsequently, a write path of the conventional semiconductor memory device is described with reference to FIGS. 2 and 3.

FIG. 2 is a block diagram illustrating a write path of the conventional semiconductor memory device, and FIG. 3 is a schematic illustrating the inside of a write circuit shown in FIG. 2.

Referring to FIG. 2, the write path of the conventional semiconductor memory device includes first to the fourth pads DQ0 to DQ3 for receiving first to fourth write data DIN<0:3> from outside of the semiconductor memory device; and a write circuit 140 for generating first to $64^{th}$ array data GIO_OT<0:63> in response to data strobe signals DQS and DQSB, a write enable signal GIO_EN, and the first to fourth write data DIN<0:3> that are transferred through the first to fourth pads DQ0 to DQ3. Herein, the first to $64^{th}$ array data GIO_OT<0:63> are transferred through global input/output lines. The global input/output lines correspond to the second global input/output lines through which the first to eighth compressed data GIO_OT#<0:7> are transferred.

Meanwhile, the write circuit 140 includes first to fourth data array blocks 141, 143, 145 and 147. The first to fourth data array blocks 141 to 147 arrange the first to fourth write data DIN<0:3> corresponding thereto and load the data on 16 global input/output lines corresponding thereto among the 64 global input/output lines in response to the data strobe signals DQS and DQSB and the write enable signal GIO_EN.

For example, the first data array block 141 arranges the first write data DIN<0> and outputs 16 first array data GIO_OT#<0> and GIO_OT#<4> in response to the data strobe signals DQS and DQSB and the write enable signal GIO_EN. In detail, referring to FIG. 3, the first data array block 141 comprises first to eighth data array units 141A_1, 141A_3, 141A_5, 141A_7, 141B_1, 141B_3, 141B_5 and 141B_7. The first data array unit 141A_1 outputs respective array data GIO_OT6<0> and GIO_OT6<4> and a respective latched data strobe signal DQS_LAT<0> based on the first write data DIN<0>, the data strobe signals DQS and DQSB, and the write enable signal GIO_EN. The second data array unit 141A_3 outputs respective array data GIO_OT4<0> and GIO_OT4<4> and a respective latched data strobe signal DQS_LAT<1> based on the latched data strobe signal DQS_LAT<0>, the data strobe signals DQS and DQSB, and the write enable signal GIO_EN. The third data array unit 141A_5 outputs respective array data GIO_OT2<0> and GIO_OT2<4> and a respective latched data strobe signal DQS_LAT<2> based on the latched data strobe signal DQS_LAT<1>, the data strobe signals DQS and DQSB, and the write enable signal GIO_EN. The fourth data array unit 141A_7 outputs respective array data GIO_OT0<0> and GIO_OT0<4> based on the latched data strobe signal DQS_LAT<2>, the data strobe signals DQS and DQSB, and the write enable signal GIO_EN. Likewise, the fifth to eighth data array units 141B_1 to 141B_7 outputs respective array data GIO_OT#<0> and GIO_OT#<4> based on the data strobe signals DQS and DQSB, and the write enable signal GIO_EN, and the first write data DIN<0> or respective latched data strobe signals DQSB_LAT<0:2>.

Of course, although not illustrated in the drawing, the second data array block 143 arranges the second write data DIN<1> and outputs 16 second array data GIO_OT#<1> and GIO_OT#<5> in response to the data strobe signals DQS and DQSB and the write enable signal GIO_EN. Also, the third data array block 145 arranges the third write data DIN<2> and outputs 16 third array data GIO_OT#<2> and GIO_OT<6> in response to the data strobe signals DQS and DQSB and the write enable signal GIO_EN. The fourth data array block 147 arranges the fourth write data DIN<3> and outputs 16 fourth array data GIO_OT#<3> and GIO_OT#<7> in response to the data strobe signals DQS and DQSB and the write enable signal GIO_EN. As a result, the 64 array data GIO_OT#<0:7> are outputted as the first to $64^{th}$ array data GIO_<0:63>.

Hereafter, the operation of the semiconductor memory device having the above structure is described.

In this specification, the operation is described in the order of a write operation followed by a read operation.

First, the write operation of the semiconductor memory device is described.

When the first to fourth write data DIN<0:3> are applied through the first to fourth pads DQ0 to DQ3 according to the write operation, the first to fourth data array blocks 141 to 147 arrange the first to fourth write data DIN<0:3> in response to the data strobe signals DQS and DQSB, drive 64 total global input/output lines (16 each) in response to the write enable signal GIO_EN, and load the first to $64^{th}$ array data GIO_<0:63> on the 64 global input/output lines.

The first to $64^{th}$ array data GIO_<0:63> loaded on the 64 global input/output lines are written in the first to eighth banks 111 to 118.

Hereafter, the read operation of the semiconductor memory device is described.

First, when the first bank 111, the second bank 113, the third bank 115, and the fourth bank 117 are activated according to the read operation, the first bank data TGIO0<0:127>, the second bank data TGIO1<0:127>, the third bank data TGIO2<0:127>, and the fourth bank data TGIO3<0:127> are output. Then, the first compression block 121, the third compression block 123, the fifth compression block 125, and the seventh compression block 127 compress the first bank data TGIO0<0:127>, the second bank data TGIO1<0:127>, the third bank data TGIO2<0:127>, and the fourth bank data TGIO3<0:127>, and output the first compressed data GIO_OT0<0:7>, the third compressed data GIO_OT2<0:7>, the fifth compressed data GIO_OT4<0:7>, the seventh compressed data GIO_OT6<0:7>, respectively.

Next, the first to fourth pipe latches 131A, 133A, 135A and 137A serialize the first compressed data GIO_OT0<0:7>, the third compressed data GIO_OT2<0:7>, the fifth compressed data GIO_OT4<0:7>, and the seventh compressed data GIO_OT6<0:7>, and output the first to fourth serial data DOUT<0:3>.

The first to fourth output circuits 131B, 133B, 135B and 137B output the first to fourth serial data DOUT<0:3> as the first to fourth read data DATA_DRV<0:3> to the first to fourth pads DQ0 to DQ3 in response to the read enable signal DRV_EN.

Accordingly, a pass/failure decision is made for the first bank 111, the second bank 113, the third bank 115, and the fourth bank 117 based on the first to fourth read data DATA_DRV<0:3> outputted through the first to fourth pads DQ0 to DQ3.

Subsequently, when the fifth bank 112, the sixth bank 114, the seventh bank 116, and the eighth bank 118 are activated, the fifth bank data TGIO4_<0:127>, the sixth bank data TGIO5_<0:127>, the seventh bank data TGIO6_<0:127>, and the eighth bank data TGIO7_<0:127> are output. Then, the second compression block 122, the fourth compression block 124, the sixth compression block 126, and the eighth compression block 128 compress the fifth bank data TGIO4_<0:127>, the sixth bank data TGIO5_<0:127>, the seventh bank data TGIO6_<0:127>, and the eighth bank data TGIO7_<0:127>, and output the second compressed data GIO_OT1<0:7>, the fourth compressed data GIO_OT3<0:7>, the sixth compressed data GIO_OT5<0:7>, and the eighth compressed data GIO_OT7<0:7>, respectively.

Next, the first to fourth pipe latches 131A, 133A, 135A and 137A serialize the second compressed data GIO_OT1<0:7>, the fourth compressed data GIO_OT3<0:7>, the sixth compressed data GIO_OT5<0:7>, and the eighth compressed data GIO_OT7<0:7>, and output the first to fourth serial data DOUT<0:3>.

The first to fourth output circuits 131B, 133B, 135B and 137B output the first to fourth serial data DOUT<0:3> as the first to fourth read data DATA_DRV<0:3> to the first to fourth pads DQ0 to DQ3 in response to the read enable signal DRV_EN.

Accordingly, a pass/failure decision is made for the fifth bank 112, the sixth bank 114, the seventh bank 116, and the eighth bank 118 based on the first to fourth read data DATA_DRV<0:3> outputted through the first to fourth pads DQ0 to DQ3.

Since the conventional semiconductor memory device having the above structure simultaneously activates many banks at once and performs write/read operations onto data, the test time may be shortened.

The conventional semiconductor memory device having the above structure has the following drawbacks.

As mentioned above, the first to fourth pads DQ0 to DQ3 are used during the parallel test of the X4 mode. Compared with a case where a test operation is performed for each memory cell, the parallel test operation certainly reduces the test time. However, there is limitation in shortening the test time when a parallel test is performed onto a plurality of semiconductor memory devices all at once.

SUMMARY

Exemplary embodiments of the present invention are directed to a semiconductor memory device that may minimize the total test time when a parallel test is performed.

Other exemplary embodiments of the present invention are directed to a semiconductor memory device that may perform a parallel test through one pad by supporting a parallel test of an X1 mode.

In accordance with an exemplary embodiment of the present invention, a semiconductor memory device includes a read circuit configured to sequentially output a plurality of compressed data corresponding to all banks which are to be tested in response to a plurality of bank addresses and a read enable signal during a test mode, and a pad configured to transfer the compressed data which are sequentially outputted from the read circuit to an outside of the semiconductor memory device.

In accordance with another exemplary embodiment of the present invention, a semiconductor memory device includes a plurality of banks, a plurality of compression blocks configured to compress a plurality of first read data respectively provided by the banks and output a plurality of second read data, a plurality of pipe latches configured to latch the second read data and output third read data in series, an output controller configured to receive the third read data from the pipe latches and sequentially output fourth read data in response to a plurality of bank addresses and a read enable signal, and a pad configured to transfer the fourth read data sequentially outputted from the output controller to an outside of the semiconductor memory device.

In accordance with yet another exemplary embodiment of the present invention, a semiconductor memory device includes a pad configured to receive a first write data from outside of the semiconductor memory device, and a write circuit configured to generate a plurality of second write data which are to be written in memory cells of all banks to be tested in response to a test mode signal, data strobe signals, a write enable signal, and the first write data transferred through the pad.

DETAILED DESCRIPTION

Figure 1:
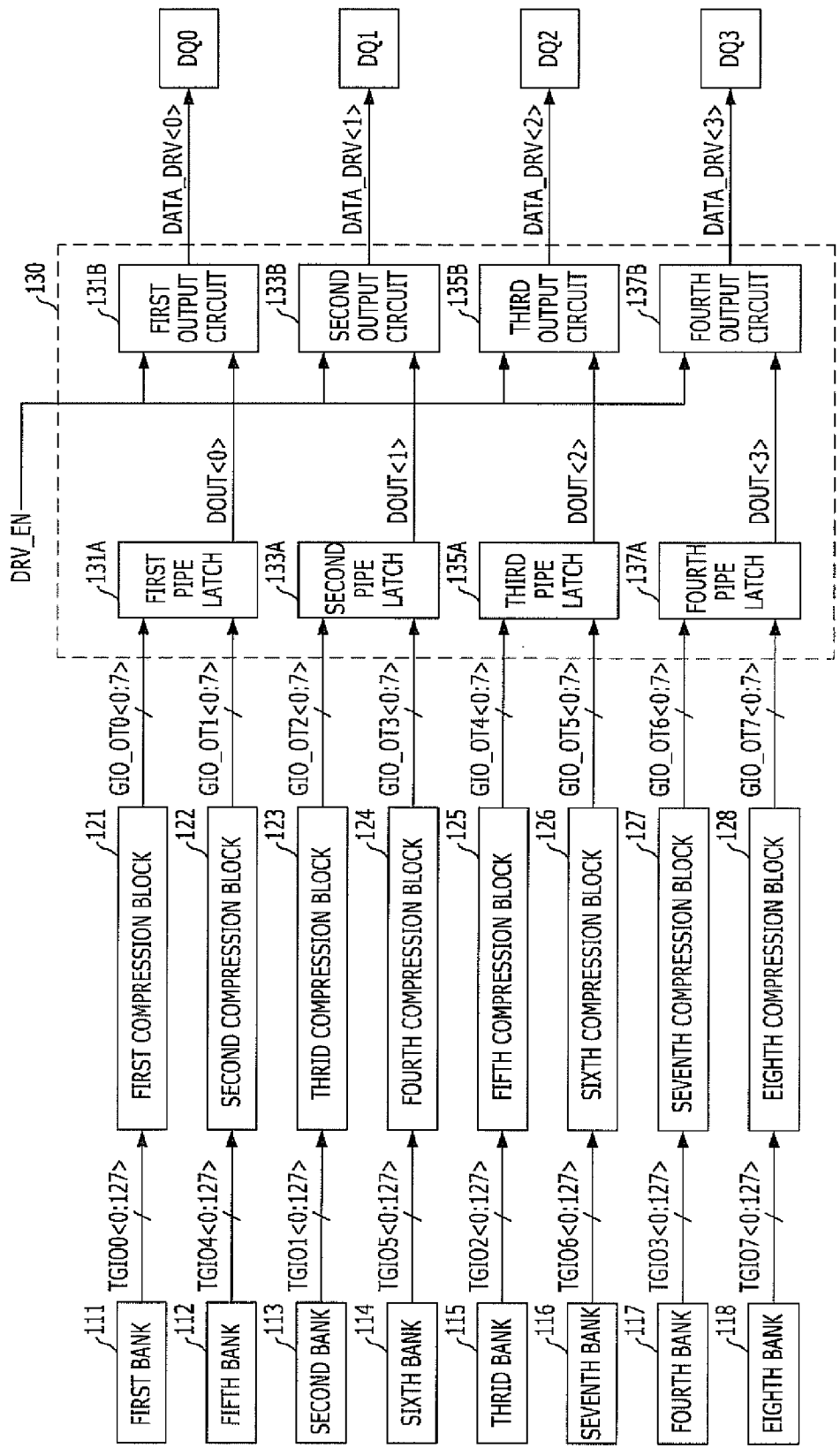
FIG. 1 is a block diagram illustrating a read path of a conventional semiconductor memory device.
Figure 2:
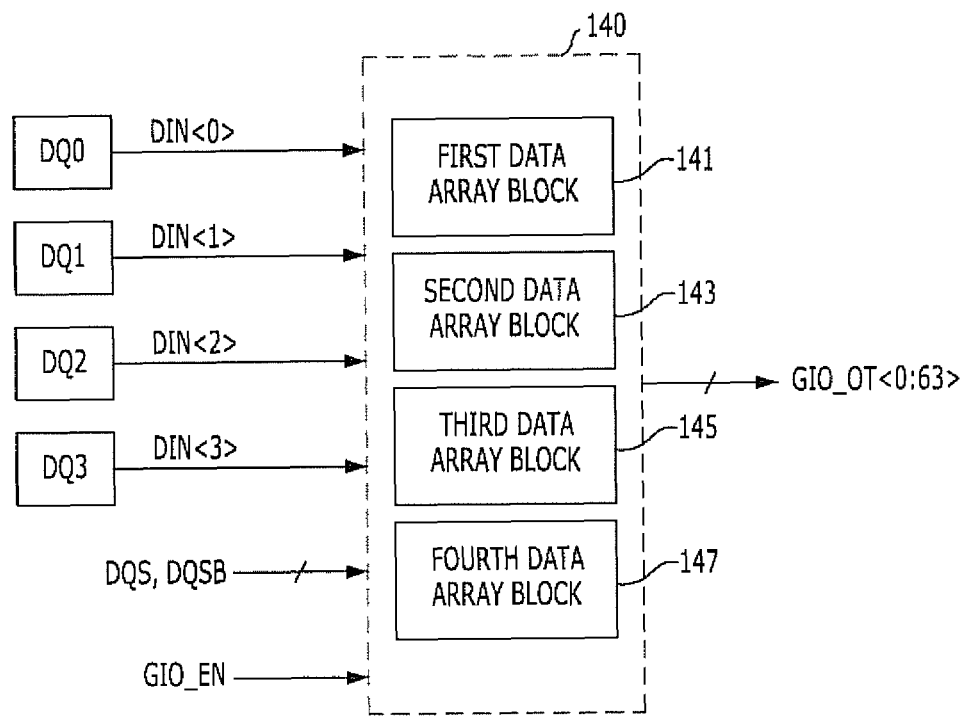
FIG. 2 is a block diagram illustrating a write path of the conventional semiconductor memory device.
Figure 3:
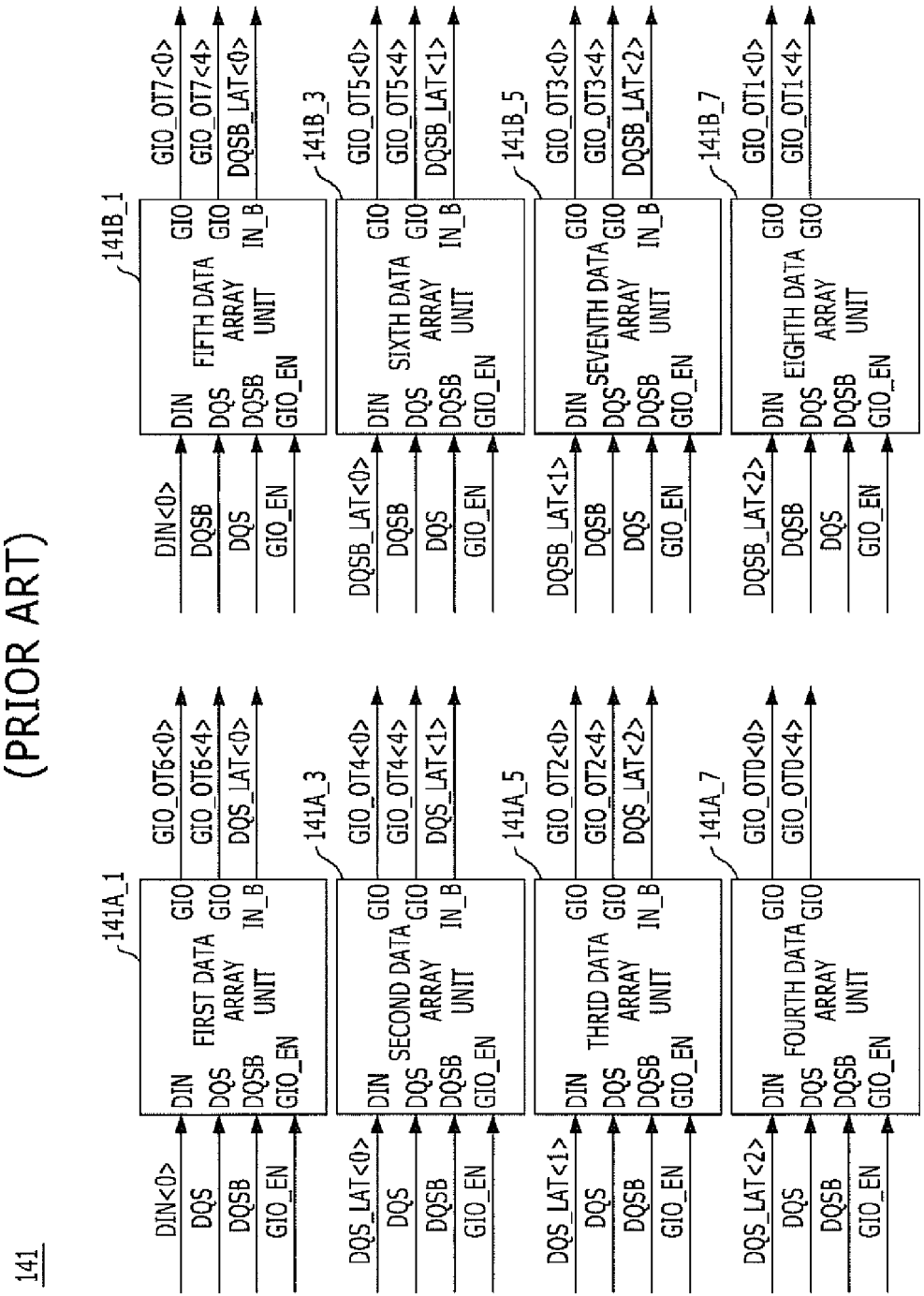
FIG. 3 is a schematic illustrating a first data array unit of a write circuit shown in FIG. 2.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. Also, the symbol '#' used in reference characters to indicate various signals corresponds to all numbers.

Figure 4:
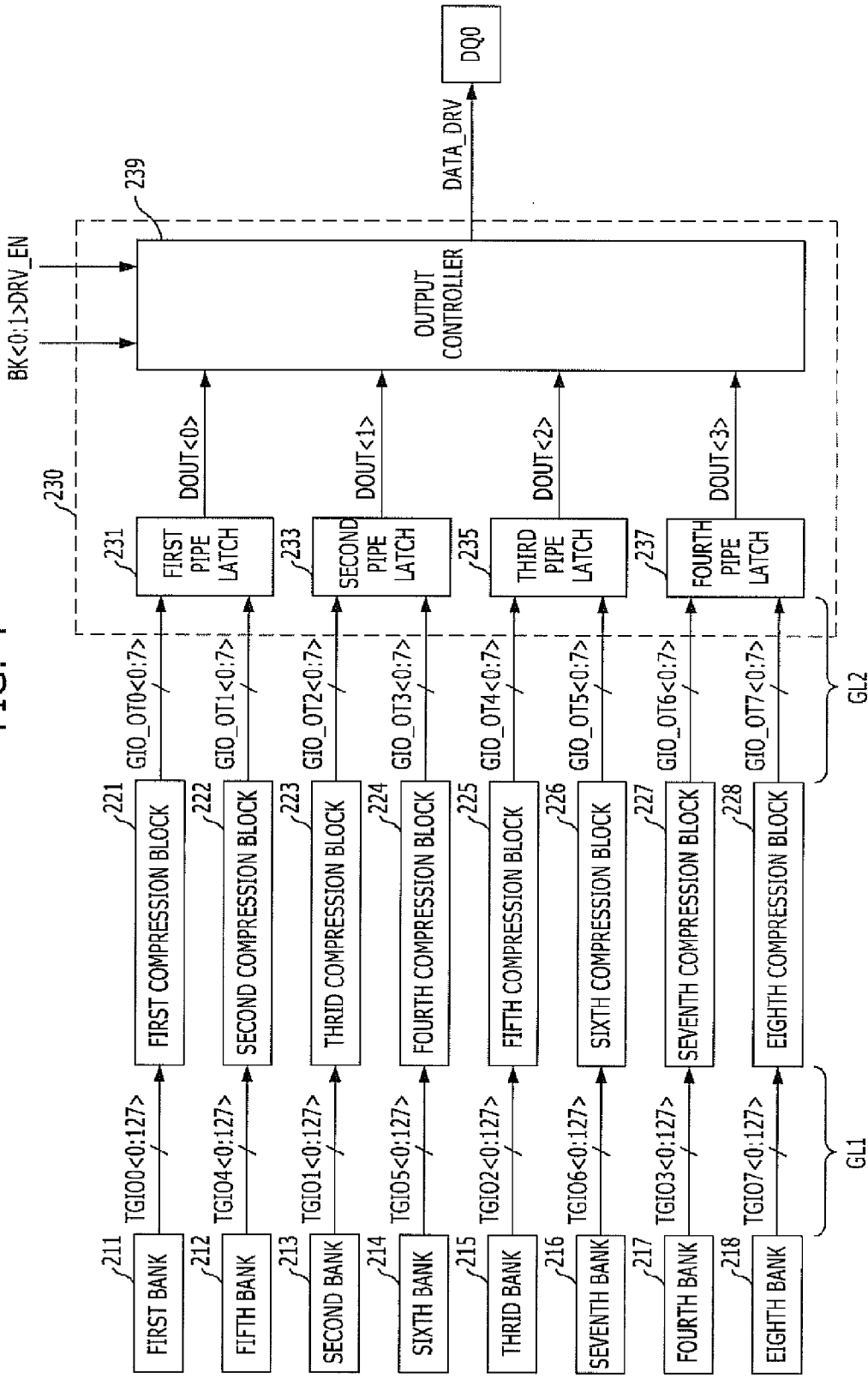
FIG. 4 is a block diagram illustrating a read path of a semiconductor memory device in accordance with an exemplary embodiment of the present invention.

FIG. 4 is a block diagram illustrating a read path of a semiconductor memory device in accordance with an exemplary embodiment of the present invention.

Referring to FIG. 4, the read path includes first to eighth banks 211, 212, 213, 214, 215, 216, 217 and 218; first to eighth compression blocks 221, 222, 223, 224, 225, 226, 227 and 228 which compress first to eighth bank data TGIO#<0:127> and output first to eighth compressed data GIO_OT#<0:7>; a read circuit 230 which sequentially outputs the first to eighth compressed data GIO_OT#<0:7> in response to first and second bank addresses BK<0:1> and a read enable signal DRV_EN; and a pad DQ0 for transferring read data DATA_DRV sequentially outputted from the read circuit 230. Herein, the first to eighth bank data TGIO#<0:127> are transferred though first global input/output lines disposed in a core region, and the first to eighth compressed data GIO_OT#<0: 7> are transferred though second global input/output lines disposed in a peripheral region.

Figure 5:
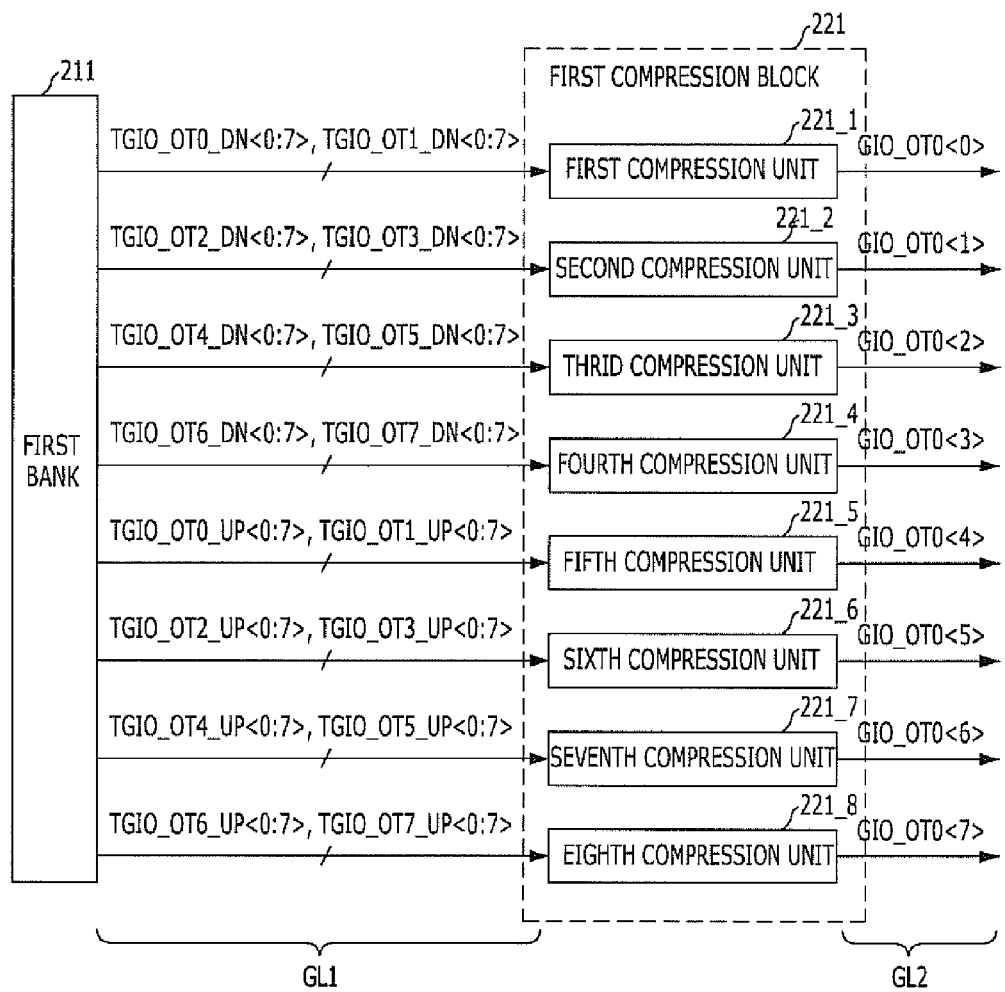
FIG. 5 is a block diagram illustrating the outputs of a first bank and a first compression block shown in FIG. 4.
Figure 6:
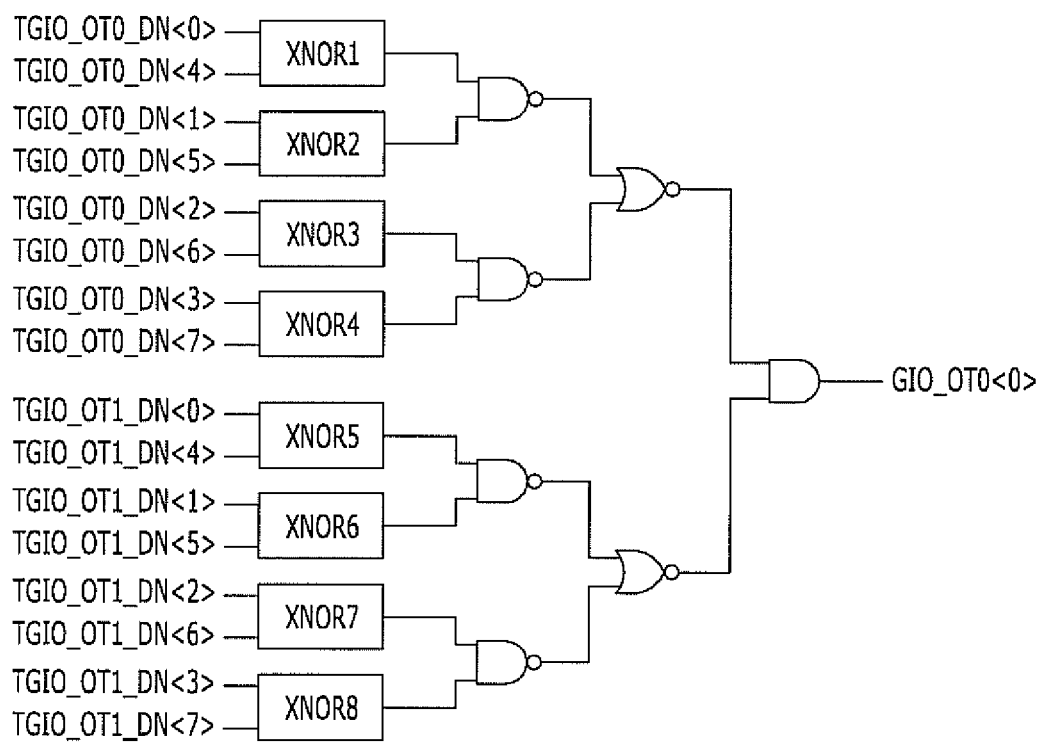
FIG. 6 is a schematic exemplarily illustrating a first compression unit shown in FIG. 5.

FIG. 5 is a block diagram illustrating the outputs of a first bank 211 and a first compression block 221 shown in FIG. 4, and FIG. 6 is a schematic diagram exemplarily illustrating a first compression unit 221_1 shown in FIG. 5.

Referring to FIG. 5, although the first bank 211 is not illustrated in detail, the memory cells included inside of the first bank 211 are divided into 8 octet regions OT. Each octet region includes an upper region UP and a lower region DN. The first bank 211 having such a structure pairs two octet regions OT during a read operation and outputs first to eighth lower bank data TGIO_OT#_DN<0:7> and first to eighth upper bank data TGIO_OT#_UP<0:7> to the first compression block 221. Herein, the first to eighth lower bank data TGIO_T#_DN<0:7> and first to eighth upper bank data TGIO_T#_UP<0:7> correspond to the first bank data TGIO0<0:127> of FIG. 4, and they are outputted to the first compression block 221 through a total of 128 first global input/output lines GL1.

The first compression block 221 includes first to eighth compression units 221_1, 221_2, 221_3, 221_4, 221_5, 221_6, 221_7 and 221_8. The first to eighth compression units 221_1 to 221_8 compress a pair of corresponding data among the first to eighth lower bank data TGIO_OT#_DN<0:7> and first to eighth upper bank data TGIO_T#_UP<0:7> that are provided by pairing two octet regions OT from the first bank 211, and outputs first to eighth unit compressed data GIO_OT0<#> to the read circuit 230. For example, as shown in FIG. 6, the first compression unit 221_1 comprises a plurality of logic gates XNOR1 to XNOR8, and compresses the first lower bank data TGIO_OT0_DN<0:7> and the second lower bank data TGIO_OT1_DN<0:7> and outputs the first unit compressed data GIO_OT0<0>. The first to eighth unit compressed data GIO_OT0<#> correspond to the first compressed data GIO_OT0<0:7> of FIG. 4, and the first to eighth unit compressed data GIO_OT0<#> are outputted to the read circuit 230 through a total of 8 second global input/output lines GL2.

Meanwhile, the second to eighth banks 212 to 218 have the same structure as the first bank 211, and the second to eighth compression blocks 222 to 228 have the same structure as the first compression block 221. Therefore, further descriptions on the second to eighth banks 212 to 218 and the second to eighth compression blocks 222 to 228 are omitted herein.

Referring back to FIG. 4, the read circuit 230 includes first to fourth pipe latches 231, 233, 235 and 237 and an output controller 239. The first to fourth pipe latches 231 to 237 latch the first to eighth compressed data GIO_OT#<0:7> and output first to fourth serial data DOUT<0:3>. The output controller 239 sequentially outputs the first to fourth serial data DOUT<0:3> outputted from the first to fourth pipe latches 231 to 237 in response to the first and second bank addresses BK<0:1> and the read enable signal DRV_EN. Herein, the first pipe latch 231 serializes the first compressed data GIO_OT0<0:7> or the second compressed data GIO_OT1<0:7> that are outputted from the first compression block 221 and the second compression block 222, respectively, and outputs the first serial data DOUT<0>. The second pipe latch 233 serializes the third compressed data GIO_OT2<0:7> or the fourth compressed data GIO_OT3<0:7> that are outputted from the third compression block 223 and the fourth compression block 224, respectively, and outputs the second serial data DOUT<1>. The third pipe latch 235 serializes the fifth compressed data GIO_OT4<0:7> or the sixth compressed data GIO_OT5<0:7> that are outputted from the fifth compression block 225 and the sixth compression block 226, respectively, and outputs the third serial data DOUT<2>. The fourth pipe latch 237 serializes the seventh compressed data GIO_OT6<0:7> or the eighth compressed data GIO_OT7<0:7> that are outputted from the seventh compression block 227 and the eighth compression block 228, respectively, and outputs the fourth serial data DOUT<3>. Meanwhile, the output controller 239 is illustrated in FIGS. 7 to 11.

Figure 7:
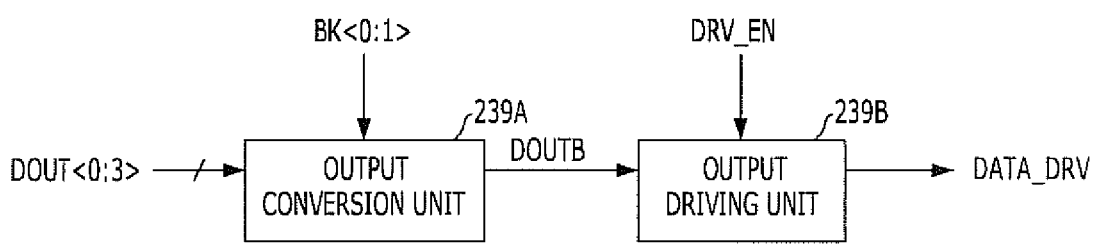
FIG. 7 is a block diagram exemplarily illustrating an output controller shown in FIG. 4.
Figure 8:
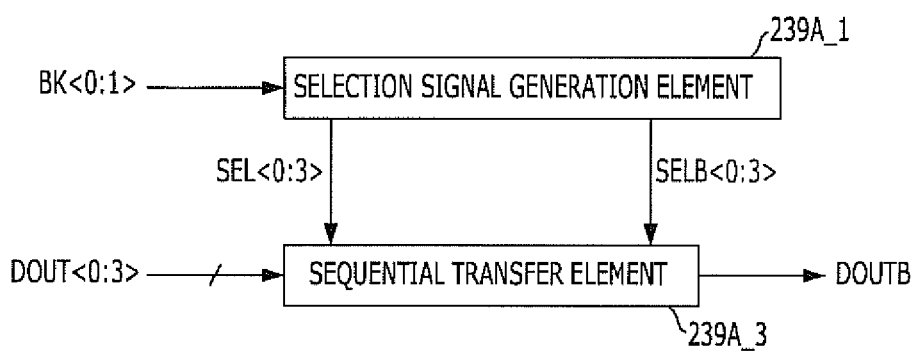
FIG. 8 is a block diagram exemplarily illustrating an output conversion unit shown in FIG. 7.
Figure 9:
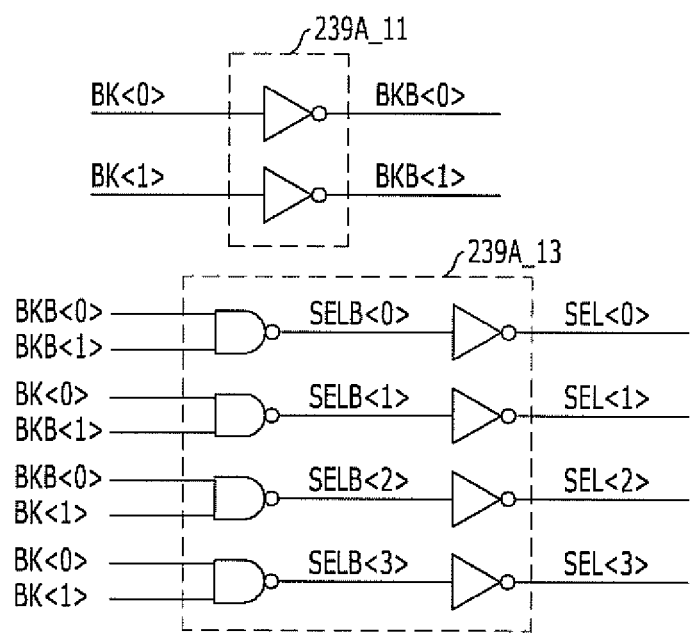
FIG. 9 is an internal circuit diagram exemplarily illustrating a selection signal generation element shown in FIG. 8.
Figure 10:
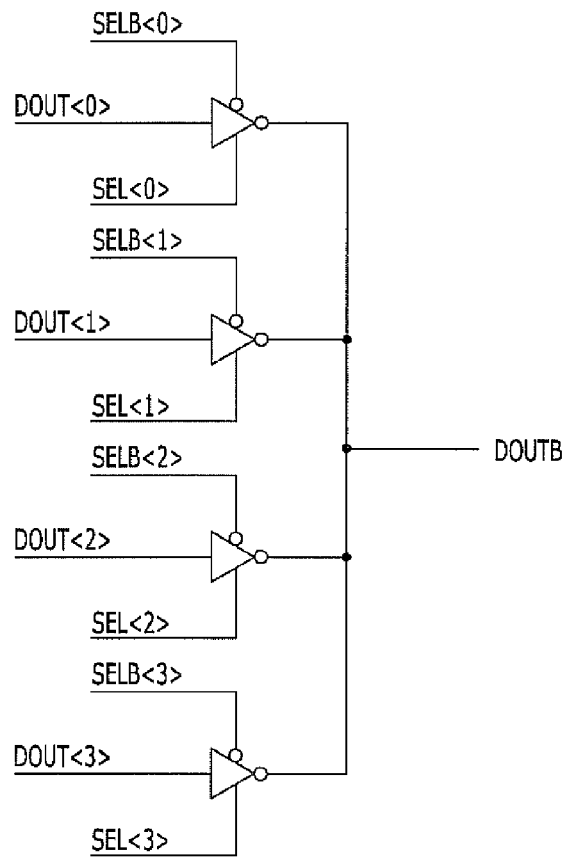
FIG. 10 is an internal circuit diagram exemplarily illustrating a sequential transfer element shown in FIG. 8.
Figure 11:
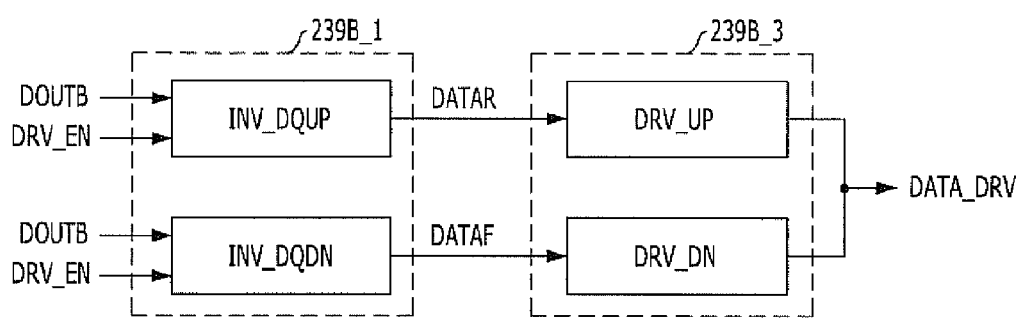
FIG. 11 is a block diagram exemplarily illustrating an output driving unit shown in FIG. 7.

FIG. 7 is a block diagram exemplarily illustrating the output controller 239 shown in FIG. 4. FIG. 8 is a block diagram exemplarily illustrating an output conversion unit shown in FIG. 7. FIG. 9 is an internal circuit diagram exemplarily illustrating a selection signal generation element shown in FIG. 8. FIG. 10 is an internal circuit diagram exemplarily illustrating a sequential transfer element shown in FIG. 8, FIG. 11 is a block diagram exemplarily illustrating an output driving unit shown in FIG. 7.

Referring to FIG. 7, the output controller 239 includes an output conversion unit 239A and an output driving unit 239B. The output conversion unit 239A serializes the first to fourth serial data DOUT<0:3>, which are outputted from the first to fourth pipe latches 231 to 237, and outputs a serialized data DOUTB in response to the first and second bank addresses BK<0:1>. The output driving unit 239B outputs the serialized data DOUTB to one pad DQ0 in response to the read enable signal DRV_EN.

Herein, as illustrated in FIG. 8, the output conversion unit 239A includes a selection signal generation element 239A_1 and a sequential transfer element 239A_3. The selection signal generation element 239A_1 generates first to fourth selection signals SEL<0:3> and first to fourth inverse selection signals SELB<0:3> that are sequentially enabled by decoding the first and second bank addresses BK<0:1>. The sequential transfer element 239A_3 sequentially transfers the first to fourth serial data DOUT<0:3> and outputs the serialized data DOUTB in response to the first to fourth selection signals SEL<0:3> and the first to fourth inverse selection signals SELB<0:3>.

The selection signal generation element 239A_1, as illustrated in FIG. 9, includes an inversion unit 239A_11 and a logic combiner 239A_13. The inversion unit 239A 11 inverts the first and second bank addresses BK<0:1> and outputs first and second inverted bank addresses BKB<0:1>. The logic combiner 239A_13 outputs the first to fourth selection signals SEL<0:3> and SELB<0:3> by logically combining (e.g., by performing NAND operations) the first and second bank addresses BK<0:1> with the first and second inverted bank addresses BKB<0:1> outputted from the inversion unit 239A_11.

The sequential transfer element 239A_3 has a structure where the outputs of four tri-state inverters are coupled in parallel, as illustrated in FIG. 10. Each of the tri-state inverters sequentially outputs the first to fourth serial data DOUT<0:3> in response to the first to fourth selection signals SEL<0:3> and SELB<0:3>. Herein, the outputted data are the serialized data DOUTB, which are the inverted data of the first to fourth serial data DOUT<0:3>.

Referring to FIG. 11, the output driving unit 239B includes a pre-driving element 239B_1 and a main-driving element 239B_3. The pre-driving element 239B_1 comprises first and second sub-sections INV_DQUP and INV_DQDN, and controls the slew rate of the serialized data DOUTB, outputted from the output conversion unit 239A, in response to the read enable signal DRV_EN to output first and second pre-read data DATAR and DATAF. The main-driving element 239B_3 comprises first and second sections DRV_UP and DRV_DN, and outputs the read data DATA_DRV by controlling the driving force of the first and second pre-read data DATAR and DATAF of the pre-driving element 239B_1. Since the pre-driving element 239B_1 and the main-driving element 239B_3 are known technology, a detailed description of them is omitted herein.

Figure 12:
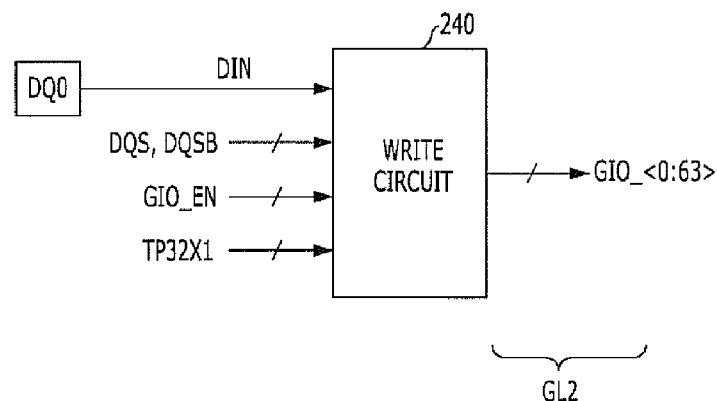
FIG. 12 is a block diagram illustrating a write path of a semiconductor memory device in accordance with an exemplary embodiment of the present invention.

FIG. 12 is a block diagram illustrating a write path of a semiconductor memory device in accordance with an exemplary embodiment of the present invention.

Referring to FIG. 12, the write path of a semiconductor memory device in accordance with an exemplary embodiment of the present invention includes one pad DQ0 and a write circuit 240. The pad DQ0 receives a write data DIN from the outside of the semiconductor memory device. The write circuit 240 generates first to $64^{th}$ array data GIO_<0: 63> in response to a test mode signal TP32X1, the data strobe signals DQS and DQSB, the write enable signal GIO_EN, and the write data DIN transferred through the pad DQ0. Herein, the pad DQ0 is commonly used for both read path and write path, and the write data DIN has a predetermined burst length. Also, the first to $64^{th}$ array data GIO_<0:63> are loaded on the global input/output lines. The global input/output lines are the same as the second global input/output lines GL2 which are used for the read path shown in FIG. 4.

Figure 13:
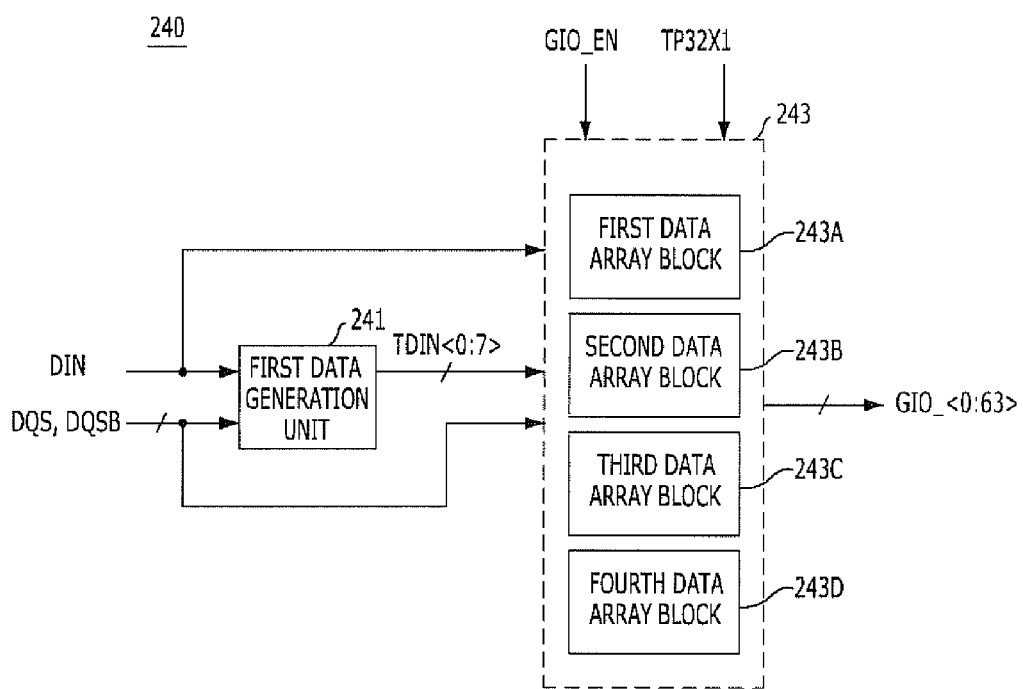
FIG. 13 is a block diagram exemplarily illustrating a write circuit shown in FIG. 12.
Figure 14:
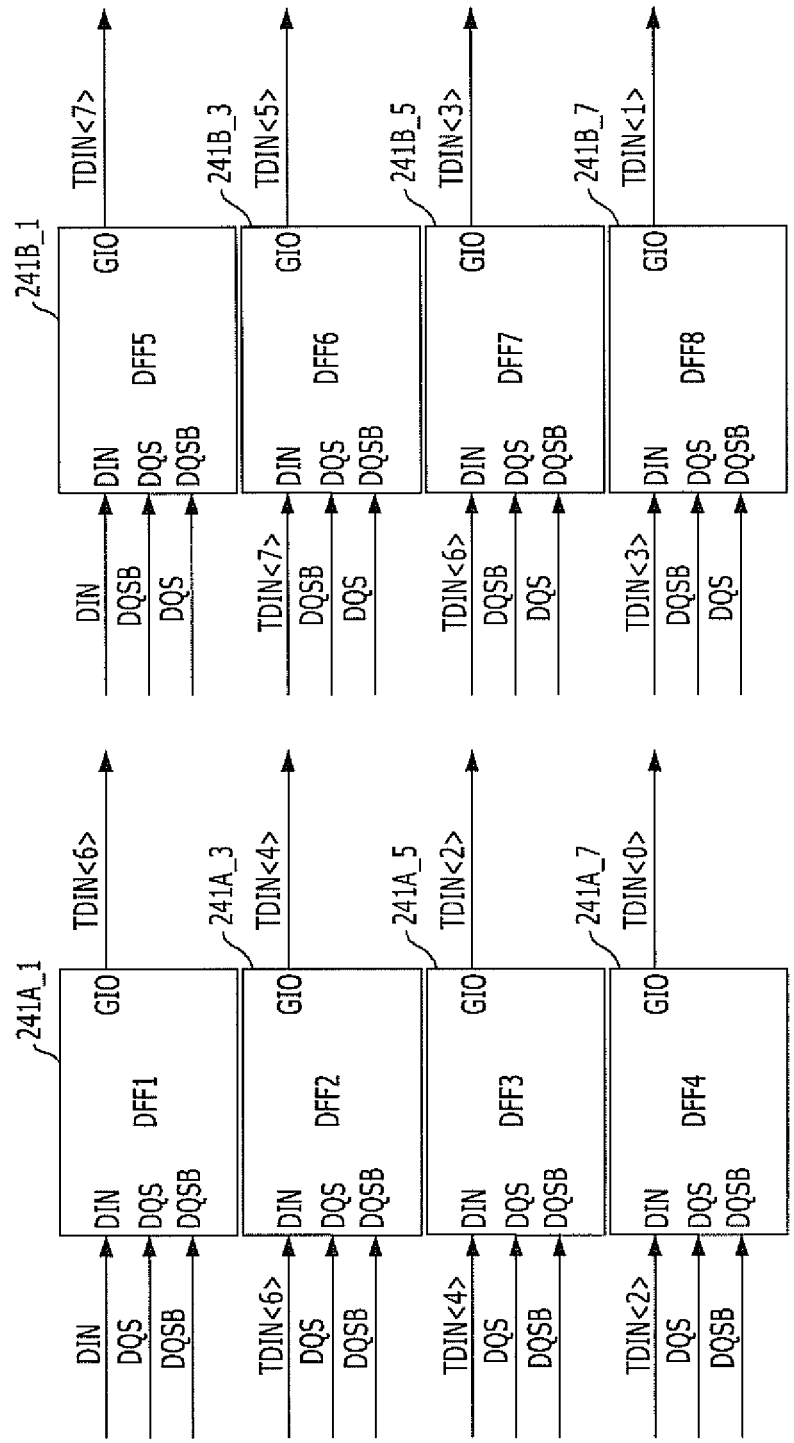
FIG. 14 is a block diagram exemplarily illustrating a first data generation unit shown in FIG. 13.
Figure 15:
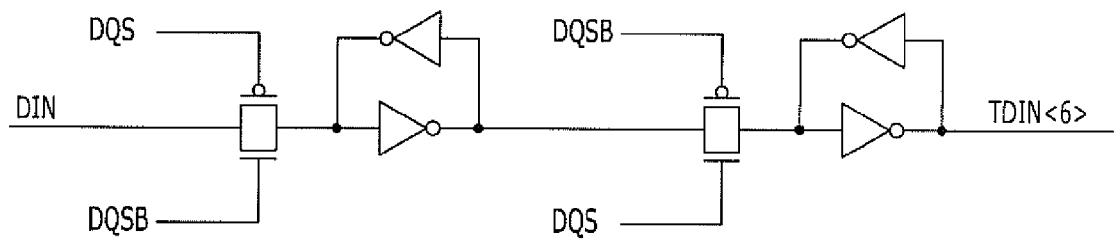
FIG. 15 is an internal circuit diagram exemplarily illustrating a first latch shown in FIG. 14.
Figure 16:
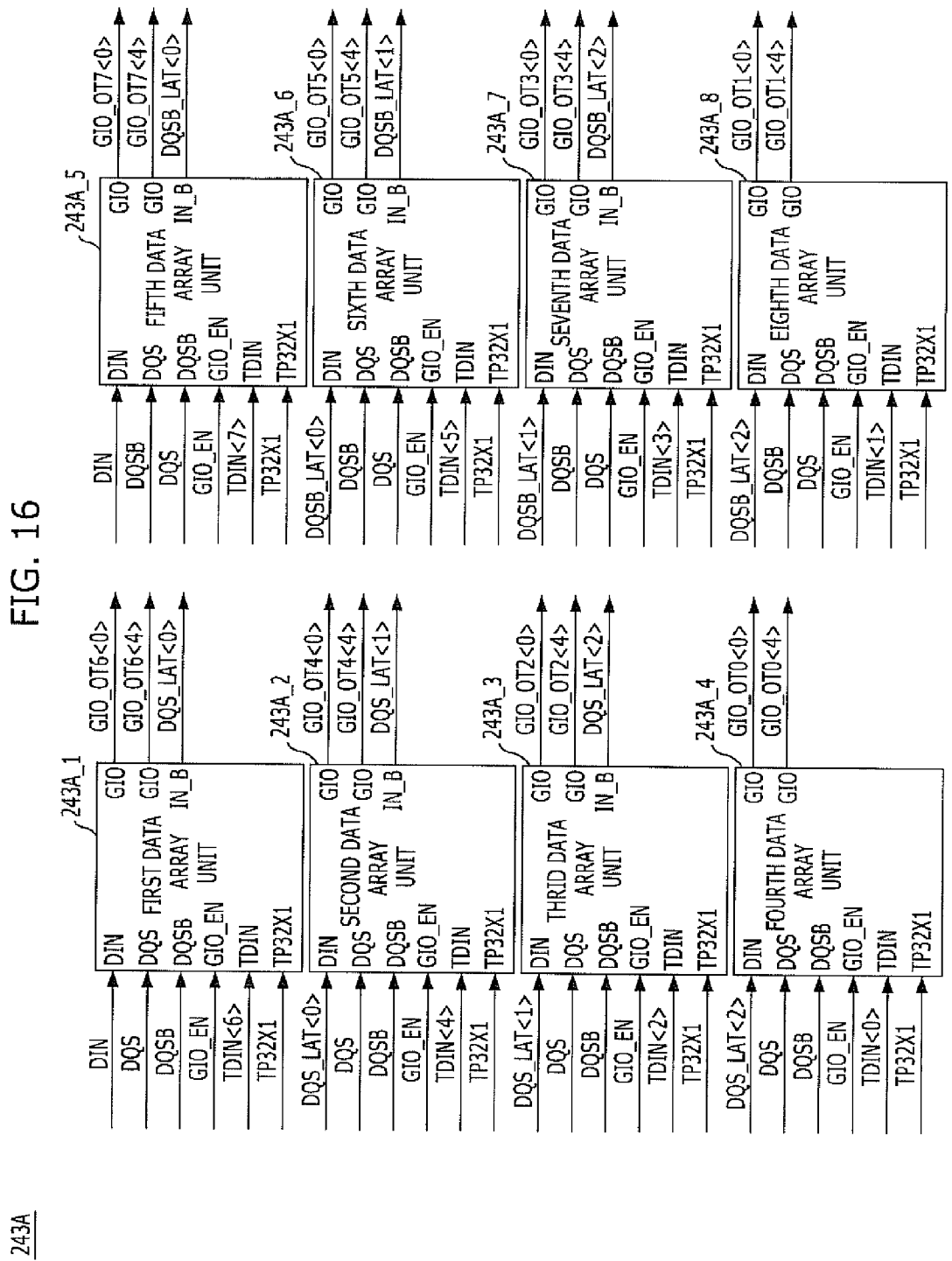
FIG. 16 is a block diagram exemplarily illustrating a first data array block shown in FIG. 13.
Figure 17:
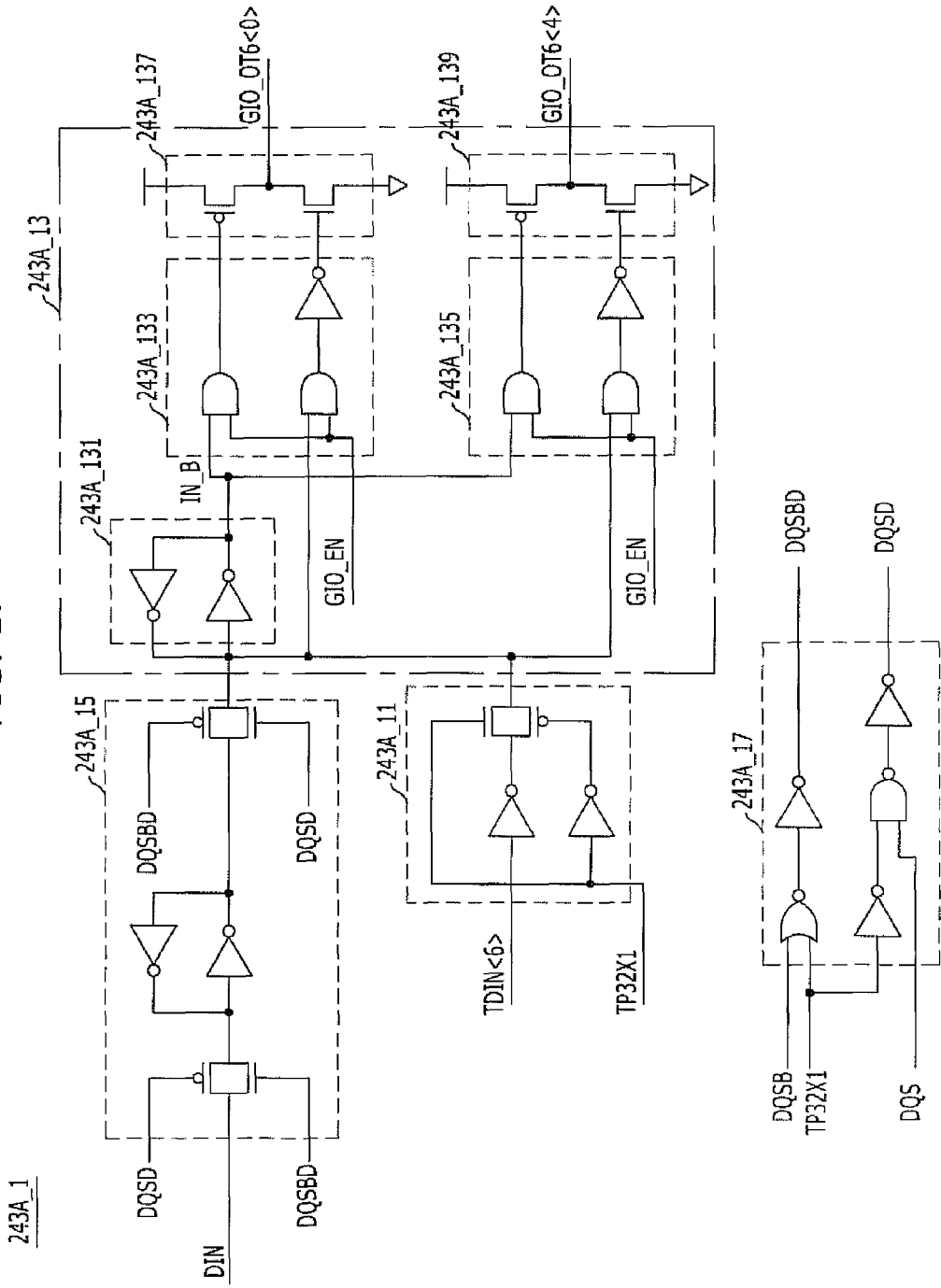
FIG. 17 is an internal circuit diagram exemplarily illustrating a first data array unit shown in FIG. 16.

FIG. 13 is a block diagram exemplarily illustrating the write circuit 240 shown in FIG. 12. FIG. 14 is a block diagram exemplarily illustrating a first data generation unit 241 shown in FIG. 13. FIG. 15 is an internal circuit diagram exemplarily illustrating a first latch 241A_1 shown in FIG. 14. FIG. 16 is a block diagram exemplarily illustrating a first data array block 243A shown in FIG. 13. FIG. 17 is an internal circuit diagram exemplarily illustrating a first data array unit 243A_1 shown in FIG. 16.

Referring to FIG. 13, the write circuit 240 includes a first data generation unit 241 and a second data generation unit 243. The first data generation unit 241 generates first to eighth source data TDIN<0:7> in response to the write data DIN and the data strobe signals DQS and DQSB. The second data generation unit 243 generates the first to $64^{th}$ array data GIO_<0:63> in response to the first to eighth source data TDIN<0: 7>, the test mode signal TP32X1, the data strobe signals DQS and DQSB, and the write enable signal GIO_EN. Herein, the second data generation unit 243 includes first to fourth data array blocks 243A, 243B, 243C and 243D, which are described in detail below.

Referring to FIG. 14, the first data generation unit 241 includes first to eighth latches 241A_1 (DFF1), 241A_3 (DFF2), 241A_5 (DFF3), 241A_7 (DFF4), 241B_1 (DFF5), 241B_3 (DFF6), 241B_5 (DFF7) and 241B_7 (DFF8) for generating the first to eighth source data TDIN<0:7> by shifting the write data DIN based on the data strobe signals DQS and DQSB. For example, the first to eighth latches 241A_1 to 241B_7 may be realized as D-flipflops, as illustrated in FIG. 15.

As mentioned earlier, the second data generation unit 243 includes the first to fourth data array blocks 243A to 243D. Since the first to fourth data array blocks 243A to 243D have the same structure, the first data array block 243A is described as a representative example, for the sake of convenience in description. Referring to FIG. 16, the first data array block 243A includes first to eighth data array units 243A_1, 243A_2, 243A_3, 243A_4, 243A_5, 243A_6, 243A_7 and 243A_8 which arrange the first to eighth source data TDIN<0:7> and generate corresponding first to $16^{th}$ array data GIO_OT#<0> and GIO_OT#<4> among the first to $64^{th}$ array data GIO_<0:63> in response to the write data DIN, the data strobe signals DQS and DQSB, the write enable signal GIO_EN, and the test mode signal TP32X1. For reference, the first to eighth data array units 243A_1, 243A_2, 243A_3, 243A_4, 243A_5, 243A_6, 243A_7 and 243A_8 have a cascade structure so that the second, third, fourth, sixth, seventh and eighth data array units 243A_2, 243A_3, 243A_4, 243A_6, 243A_7 and 243A_8 receive an output signal of a previous data array unit, i.e., DQS_LAT<0:2> and DQSB_LAT<0:2>, instead of the write data DIN.

Herein, the first data array unit 243A_1 is taken as a representative example and described.

Referring to FIG. 17, the first data array unit 243A_1 includes a first input element 243A_11 and a line driving element 243A_13. The first input element 243A_11 selectively receives the first source data TDIN<6> in response to the test mode signal TP32X1. The line driving element 243A_13 loads the first and second array data GIO_OT6<0> and GIO_OT6<4> on the corresponding second global input/output lines GL2 in response to the first source data TDIN<6> inputted through the first input element 243A_11 and the write enable signal GIO_EN.

The line driving element 243A_13 includes a latch part 243A_131, first and second transfer parts 243A_133 and 243A_135, and first and second driving parts 243A_137 and 243A_139. The latch part 243A_131 latches the first source data TDIN<6> inputted through the first input element 243A_11. The first and second transfer parts 243A_133 and 243A_135 selectively transfer the data latched in the latch part 243A_131 in response to the write enable signal GIO_EN. The first and second driving parts 243A_137 and 243A_139 drive the corresponding second global input/output lines GL2 in response to the output of the first and second transfer parts 243A_133 and 243A_135.

Meanwhile, the first data array unit 243A_1 further includes a second input element 243A_15 and a blocking element 243A_17. The second input element 243A_15 receives the write data DIN applied through the pad DQ0 during the normal mode, which is a state where the test mode signal TP32X1 is disabled. The blocking element 243A_17 cuts off the second input element 243A_15 in response to the test mode signal TP32X1. In detail, the blocking element 243A_17 receives the data strobe signals DQS and DQSB and the test mode signal TP32X1 to generate mode control signals DQSD and DQSBD. The second input element 243A_15 selectively transfers the write data DIN in response to the mode control signals DQSD and DQSBD.

Hereafter, the operation of the semiconductor memory device having the above described structure in accordance with an exemplary embodiment of the present invention is described in detail with reference to FIGS. 18 and 19.

Figure 18:
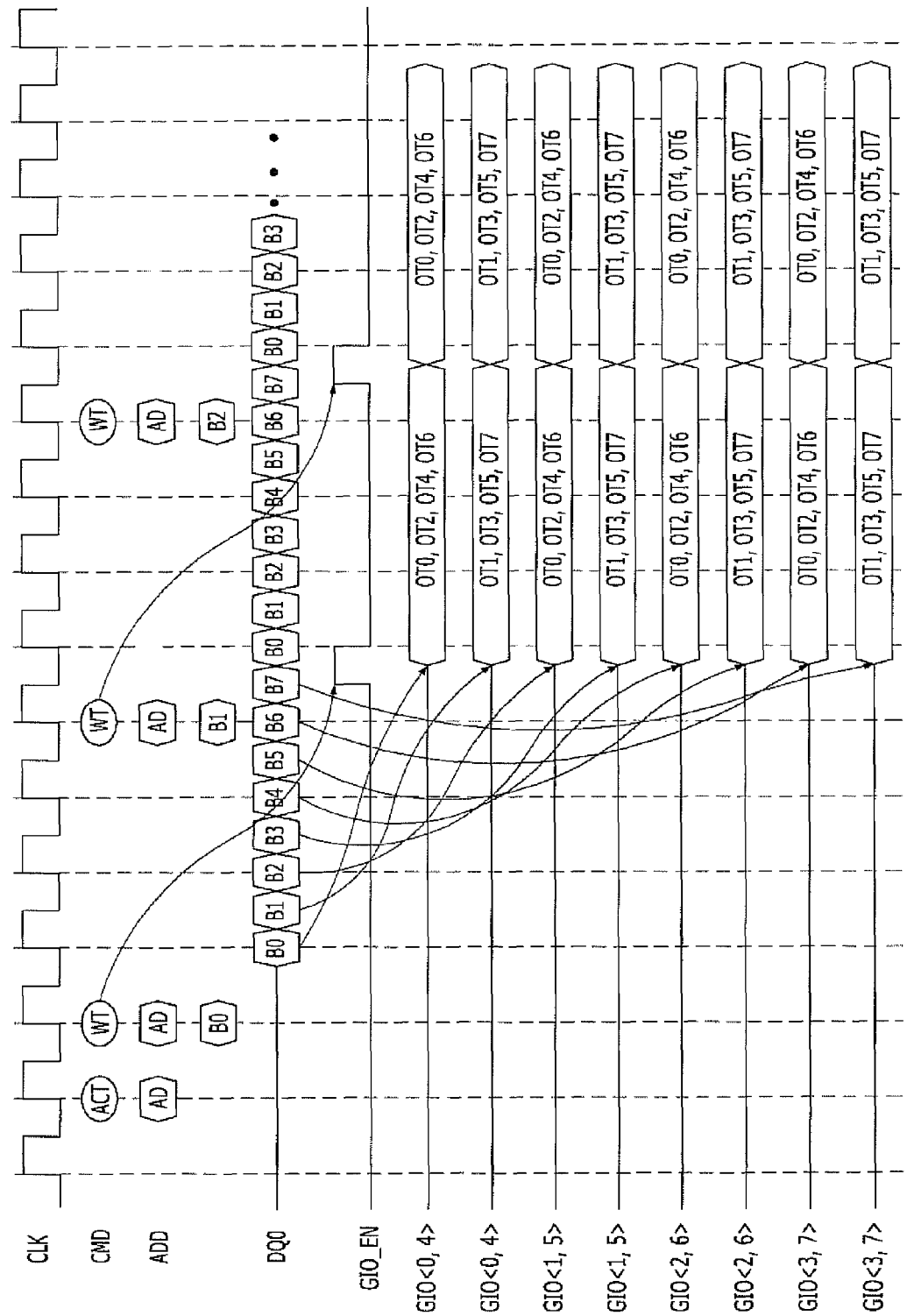
FIG. 18 is a timing diagram describing an operation of the write path in a semiconductor memory device in accordance with an exemplary embodiment of the present invention.

FIG. 18 is a timing diagram describing an operation of the write path in a semiconductor memory device during a parallel test of an X1 mode in accordance with an exemplary embodiment of the present invention. FIG. 19 is a timing diagram describing an operation of the read path in a semiconductor memory device during a parallel test of the X1 mode in accordance with an exemplary embodiment of the present invention.

Referring to FIG. 18, when a write command WT is applied after an active command ACT is applied, a write data DIN B0 to B7 having a burst length of '8' is inputted through one pad DQ0 after a write latency.

Then, the first data generation unit 241 generates the first to eighth source data TDIN<0:7> by shifting the write data DIN based on the data strobe signals DQS and DQSB. The second data generation unit 243 generates the first to $64^{th}$ array data GIO_<0:63> in response to the first to eighth source data TDIN<0:7>, the test mode signal TP32X1, the data strobe signals DQS and DQSB, and the write enable signal GIO_EN.

To explain the process of generating the first to $64^{th}$ array data GIO_<0:63> in detail, the first data array block 243A arranges the first to eighth source data TDIN<0:7> in response to the data strobe signals DQS and DQSB and the test mode signal TP32X1. The second data array block 243B arranges the first to eighth source data TDIN<0:7> in response to the data strobe signals DQS and DQSB and the test mode signal TP32X1. The third data array block 243C arranges the first to eighth source data TDIN<0:7> in response to the data strobe signals DQS and DQSB and the test mode signal TP32X1. The fourth data array block 243D arranges the first to eighth source data TDIN<0:7> in response to the data strobe signals DQS and DQSB and the test mode signal TP32X1. In this state, when the write enable signal GIO_EN is enabled, the first data array block 243A loads the first to 16$^{th}$ array data GIO_OT#<0> and GIO_OT#<4> among the first to 64$^{th}$ array data GIO_<0:63> on the corresponding 16 second global input/output lines GL2. The second data array block 243B loads the 17$^{th}$ to 32$^{nd}$ array data GIO_OT#<1> and GIO_OT#<5> among the first to 64$^{th}$ array data GIO_<0:63> on the corresponding 16 second global input/output lines GL2. The third data array block 243C loads the 33$^{rd}$ to 48$^{th}$ array data GIO_OT#<2> and GIO_OT#<6> among the first to 64$^{th}$ array data GIO_<0:63> on the corresponding 16 second global input/output lines GL2. The fourth data array block 243D loads the 49$^{th}$ to 64$^{th}$ array data GIO_OT#<3> and GIO_OT#<7> among the first to 64$^{th}$ array data GIO_<0:63> on the corresponding 16 second global input/output lines GL2. In short, the second data generation unit 243 loads the first to 64$^{th}$ array data GIO_<0:63> on the 64 second global input/output lines GL2. In the drawing, a process of loading the array data GIO_OT#<0> and GIO_OT#<4>, GIO_OT#<1> and GIO_OT#<5>, GIO_OT#<2> and GIO_OT#<6>, and GIO_T#<3> and GIO_OT#<7> is described conceptually for the sake of convenience in description. For reference, 'AD' denotes a certain address, 'B0, B1, B2' denotes respective burst operations (i.e., burst write operations), and 'GIO<0, 4>, GIO<1, 5> GIO<2, 6> GIO<3, 7>' and 'OT0 to OT7' denotes respective 64 array data by combination (e.g., GIO_OT0 <0>, GIO_OT0<4>, GIO_OT7 <7>, and the like).

Accordingly, the first to 64$^{th}$ array data GIO_<0:63> loaded on the 64 second global input/output lines GL2 are carried on a plurality of first global input/output lines GL1 through a receiver (not shown) activated during a write operation, and stored in the first to eighth banks 211 to 218.

Figure 19:
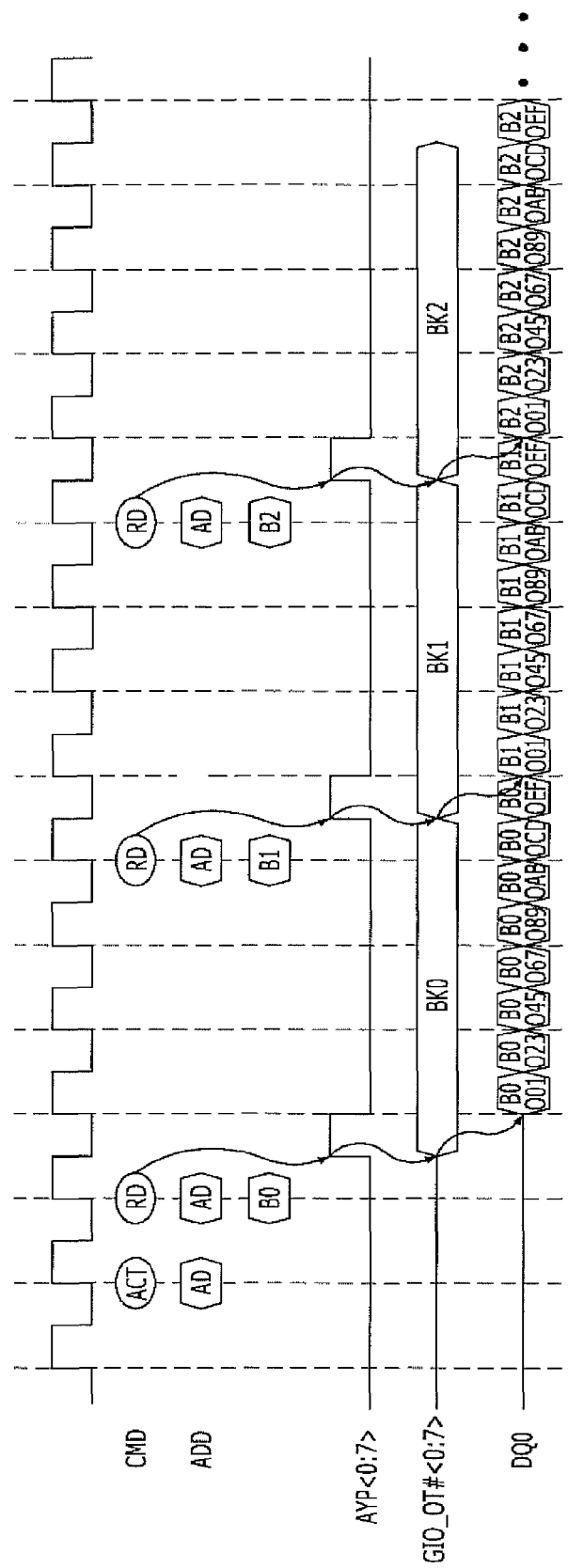
FIG. 19 is a timing diagram describing an operation of the read path in a semiconductor memory device in accordance with an exemplary embodiment of the present invention.

Referring to FIG. 19, when the write operation is completed and a read command RD is applied, the first to fourth banks 211, 213, 215 and 217 are activated according to another bank address (not shown) other than the first and second bank addresses BK<0:1>, and the first to fourth bank data TGIO0_<0:127>, TGIO1_<0:127>, TGIO2_<0:127>, and TGIO3_<0:127> are outputted from the activated first to fourth banks 211, 213, 215 and 217.

The first, third, fifth and seventh compression blocks 221, 223, 225 and 227 compress the first to fourth bank data TGIO0_<0:127>, TGIO1_<0:127>, TGIO2_<0:127>, and TGIO3_<0:127>, respectively, and output the first, third, fifth and seventh compressed data GIO_OT0<0:7>, GIO_OT2<0:7>, GIO_OT4<0:7>, and GIO_OT6<0:7>. Herein, the first, third, fifth and seventh compressed data GIO_OT0<0:7>, GIO_OT2<0:7>, GIO_OT4<0:7>, and GIO_OT6<0:7> are loaded on the corresponding 32 second global input/output lines GL2.

Accordingly, the first to fourth pipe latches 231 to 237 output the first to fourth serial data DOUT<0:3> corresponding to the first, third, fifth and seventh compressed data GIO_OT0<0:7>, GIO_OT2<0:7>, GIO_OT4<0:7>, and GIO_OT6<0:7>, and the output controller 239 sequentially outputs the first to fourth serial data DOUT<0:3> to one pad DQ0 according to the first and second bank addresses BK<0:1> and the read enable signal DRV_EN.

Subsequently, the fifth to eighth banks 212, 214, 216 and 218 are activated according to another bank address (not shown) other than the first and second bank addresses BK<0:1>, and the fifth to eighth bank data TGIO4_<0:127>, TGIO5_<0:127>, TGIO6_<0:127>, and TGIO7_<0:127> are outputted from the activated fifth to eighth banks 212, 214, 216 and 218.

Then, the second, fourth, sixth and eighth compression blocks 222, 224, 226 and 228 compress the fifth to eighth bank data TGIO4_<0:127>, TGIO5_<0:127>, TGIO6_<0:127>, and TGIO7_<0:127>, respectively, and output the second, fourth, sixth and eighth compressed data GIO_OT1<0:7>, GIO_OT3<0:7>, GIO_OT5<0:7>, and GIO_OT7<0:7>. Herein, the second, fourth, sixth and eighth compressed data GIO_OT1<0:7>, GIO_OT3<0:7>, GIO_OT5<0:7>, and GIO_OT7<0:7> are loaded on the other 32 second global input/output lines GL2.

Accordingly, the first to fourth pipe latches 231 to 237 output the first to fourth serial data DOUT<0:3> corresponding to the second, fourth, sixth and eighth compressed data GIO_OT1<0:7>, GIO_OT3<0:7>, GIO_OT4<0:7>, and GIO_OT7<0:7>, and the output controller 239 sequentially outputs the first to fourth serial data DOUT<0:3> to one pad DQ0 according to the first and second bank address BK<0:1> and the read enable signal DRV_EN.

Therefore, the read data DATA_DRV outputted through the pad DQ0 includes the compressed data corresponding to the first to eighth banks 211 to 218. For reference, 'AD' denotes a certain address, 'B0, B1, B2' denotes respective burst operations (i.e., burst read operations), 'AYP<0:7>' denotes column selection signals, 'GIO_OT#<0:7>' denotes the first to eighth compressed data as described above, and 'O01 to OEF' is employed to separate respective data (e.g., B0 O01, B0 OEF, B2 OEF, and the like).

According to an exemplary embodiment of the present invention, since a semiconductor memory device in support of an X1 mode is used, a parallel test may be performed onto more semiconductor memory devices at once. Therefore, the test time is reduced.

According to an exemplary embodiment of the present invention, the number of semiconductor memory devices that may be tested at once may be increased by supporting an X1 mode. When it is assumed that the number of test input/output units that may be tested at once is 64, a parallel test may be performed onto 64 semiconductor memory devices in an X1 mode, whereas a parallel test may be performed onto 16 semiconductor memory devices in an X4 mode. Therefore, when a parallel test is performed in the X1 mode, the test time may be minimized.

While the present invention has been described with respect to the specific embodiments, it will be apparent to those skilled in the art that various changes and modifications may be made without departing from the spirit and scope of the invention as defined in the following claims.

What is claimed is:
1. A semiconductor memory device, comprising:
a plurality of banks;
a plurality of compression blocks configured to compress a plurality of first read data respectively provided by the banks and output a plurality of second read data;
a plurality of pipe latches configured to latch the second read data and output third read data in series;
an output controller configured to receive the third read data from the pipe latches and sequentially output fourth read data in response to a plurality of bank addresses and a read enable signal; and a pad configured to transfer the fourth read data sequentially outputted from the output controller to an outside of the semiconductor memory device.

2. The semiconductor memory device of claim 1, wherein a number of the compression blocks corresponds one-to-one with a number of the banks.

3. The semiconductor memory device of claim 2, wherein each of the compression blocks comprises a plurality of compression units configured to receive a predetermined number of data among the first read data, compress the received first read data in parallel, and output the second read data.

4. The semiconductor memory device of claim 1, wherein the pipe latches latch the second read data which are outputted from a group of compression blocks among the plurality of compression blocks.

5. The semiconductor memory device of claim 4, wherein the group of compression blocks comprises two or more compression blocks.

6. The semiconductor memory device of claim 1, wherein the first read data are inputted into the compression blocks through corresponding first global input/output lines, and the second read data are inputted into the pipe latches through corresponding second global input/output lines.

7. The semiconductor memory device of claim 6, wherein the first global input/output lines are disposed in a core region, and the second global input/output lines are disposed in a peripheral region.

8. The semiconductor memory device of claim 1, wherein the output controller comprises:
an output conversion unit configured to serialize the third read data received from the pipe latches and to output the serialized third read data in response to the bank addresses; and
an output driving unit configured to output the serialized third data transferred from the output conversion unit to the pad in response to the read enable signal.

9. The semiconductor memory device of claim 8, wherein the output conversion unit comprises:
a selection signal generation element configured to generate a plurality of selection signals that are sequentially enabled by decoding the bank addresses; and
a sequential transfer element configured to sequentially transfer the third read data received from the pipe latches in response to the selection signals.

10. The semiconductor memory device of claim 9, wherein the selection signal generation element comprises:
an inverting unit configured to invert the bank addresses to output inverted bank addresses; and
a logic combiner configured to logically combine the bank addresses with the inverted bank addresses received from the inverting unit to generate the selection signals.

11. The semiconductor memory device of claim 9, wherein the sequential transfer element inverts the third read data received from the pipe latches and outputs the inverted third read data.

12. The semiconductor memory device of claim 8, wherein the output driving unit comprises:
a pre-driving element configured to control a slew rate of the data sequentially transferred from the sequential transfer element in response to the read enable signal; and
a main-driving element configured to control a driving force of an output signal of the pre-driving element.

13. The semiconductor memory device of claim 6, further comprising:
a write circuit coupled to the pad and configured to receive a first write data from outside of the semiconductor memory device through the pad and to generate a plurality of second write data which are loaded on the second global input/output lines in response to a test mode signal, data strobe signals, a write enable signal, and the first write data transferred through the pad.

14. The semiconductor memory device of claim 13, wherein the first write data have a predetermined burst length.

15. The semiconductor memory device of claim 14, wherein the write circuit comprises:
a first data generation unit configured to generate a plurality of third write data in response to the first write data and the data strobe signals; and
a second data generation unit configured to generate the plurality of second write data in response to the third write data, the test mode signal, the data strobe signals, and the write enable signal.

16. The semiconductor memory device of claim 15, wherein the first data generation unit comprises a number of latches corresponding to the burst length of the first write data, the latches configured to output the third write data.

17. The semiconductor memory device of claim 15, wherein the second data generation unit comprises a plurality of data array blocks, each comprising a number of data array units corresponding to the burst length of the first write data.

18. The semiconductor memory device of claim 17, wherein the data array units comprise:
a first input element configured to selectively receive corresponding data among the third write data in response to the test mode signal; and
a line driving element configured to load the data inputted through the first input element on corresponding global input/output lines in response to the write enable signal.

19. The semiconductor memory device of claim 18, wherein the line driving element comprises:
a latch part configured to latch a data inputted through the first input element;
first and second transfer parts configured to selectively transfer the latched data of the latch part in response to the write enable signal; and
first and second driving parts configured to drive corresponding second global input/output lines in response to outputs of the first and second transfer parts.

20. The semiconductor memory device of claim 18, wherein each of the data array units further comprises:
a second input element configured to receive the first write data applied through the pad during a normal mode, which is a state where the test mode signal is disabled; and
a blocking element configured to block the second input element from transferring the first write data in response to the test mode signal.

* * * * *